(12) United States Patent
Yang (10) Patent No.: US 11,257,872 B2
(45) Date of Patent: Feb. 22, 2022

(54) DISPLAY PANEL AND MANUFACTURING METHOD THEREOF

(71) Applicant: WUHAN CHINA STAR OPTOELECTRONICS SEMICONDUCTOR DISPLAY TECHNOLOGY CO., LTD., Hubei (CN)

(72) Inventor: Fuqiang Yang, Hubei (CN)

(73) Assignee: WUHAN CHINA STAR OPTOELECTRONICS SEMICONDUCTOR DISPLAY TECHNOLOGY CO., LTD., Hubei (CN)

( * ) Notice: Subject to any disclaimer, the term of this patent is extended or adjusted under 35 U.S.C. 154(b) by 195 days.

(21) Appl. No.: 16/753,185

(22) PCT Filed: Mar. 6, 2020

(86) PCT No.: PCT/CN2020/078230
§ 371 (c)(1),
(2) Date: Apr. 2, 2020

(87) PCT Pub. No.: WO2021/155618
PCT Pub. Date: Aug. 12, 2021

(65) Prior Publication Data
US 2021/0408166 A1     Dec. 30, 2021

(30) Foreign Application Priority Data

Feb. 7, 2020 (CN) .......................... 202010082617.8

(51) Int. Cl.
*H01L 27/32* (2006.01)
*H01L 51/52* (2006.01)
(Continued)

(52) U.S. Cl.
CPC ...... *H01L 27/3223* (2013.01); *H01L 27/3234* (2013.01); *H01L 51/5253* (2013.01);
(Continued)

(58) Field of Classification Search
CPC ............ H01L 27/3223; H01L 27/3234; H01L 51/5253; H01L 51/56; H01L 2227/323; H01L 51/50; H01L 51/0031
(Continued)

(56) References Cited

U.S. PATENT DOCUMENTS

2014/0306601 A1* 10/2014 Kim et al. ............. H05B 33/12
313/506
2016/0300894 A1   10/2016 Park
(Continued)

FOREIGN PATENT DOCUMENTS

CN     109979979 A     7/2019
CN     110611047 A     12/2019
(Continued)

*Primary Examiner* — Thinh T Nguyen (57) ABSTRACT

The present disclosure provides a display panel and a manufacturing method thereof. The display panel includes a first substrate, a second substrate, a cathode layer, a plurality of spacer columns, and an encapsulation layer. The spacer columns are disposed as at least a one-circle structure surrounding an opening hole on the second substrate, and heights of the spacer columns are gradually increased from a center of the opening hole to edges thereof. The spacer columns having different heights can reflect light again, thereby improving light extraction efficiency, luminous brightness of sub-pixels adjacent to the opening hole area, and display effect.

19 Claims, 4 Drawing Sheets

(51) Int. Cl.
*H01L 51/56* (2006.01)
*H01L 51/50* (2006.01)

(52) U.S. Cl.
CPC .............. *H01L 51/56* (2013.01); *H01L 51/50* (2013.01); *H01L 2227/323* (2013.01)

(58) Field of Classification Search
USPC .................... 257/88, 81; 438/22, 24, 46, 47
See application file for complete search history.

(56) References Cited

U.S. PATENT DOCUMENTS

2017/0214003 A1  7/2017  Lee et al.
2020/0373519 A1  11/2020  Wang

FOREIGN PATENT DOCUMENTS

KR  20160120869 A  10/2016
KR  20170088457 A  8/2017

\* cited by examiner

DISPLAY PANEL AND MANUFACTURING METHOD THEREOF

FIELD OF INVENTION

The present disclosure relates to the field of display technologies, and more particularly, to a display panel and a manufacturing method thereof.

BACKGROUND OF INVENTION

Compared to liquid crystal display devices, organic light-emitting display devices (OLEDs) have advantages of self-illumination, fast responses, lightness, and thinness, and have become an emerging technology in the display field.

With development of portable OLED products, a larger screen ratio has become a trend. To reach a more extreme full screen, mobile phone manufacturers use a variety of different designs, such as a currently designed notch screen, a pop-up camera, and a sliding screen. Although they can improve a screen ratio of mobile phones to a certain extent, appearances of mobile phones are affected, integration progress of mobile phones are hindered, and three-proof property of mobile phones are limited. In current full screen technical solutions, no matter what screen opening solutions are used, a front camera in a full screen and opening areas of each device can only render empty black picture, and the opening areas cannot display normally, which not only seriously damages integrity of pictures shown in display screens, but also becomes a key factor which restricts screen ratio to be further improved.

Therefore, it is necessary to provide a solution for the problems in current technology.

Technical problem: in summary, in current OLED display panels, images in an opening hole area corresponding to a camera on a display screen cannot display normally, which reduces display effect of the screen, and meanwhile a structure design of the opening hole area hinders the display panel from developing toward a full screen.

SUMMARY OF INVENTION

To solve the above technical problems, an embodiment of the present disclosure provides technical solutions as follows:

In a first aspect, an embodiment of the present disclosure provides a display panel. The display panel comprises:
a display area including at least one light-transmitting sub-area;
wherein the display panel comprises:
a first substrate;
a second substrate disposed on the first substrate and provided with an opening hole at a position corresponding to the light-transmitting sub-area;
a cathode layer disposed on the second substrate;
a plurality of spacer columns disposed in the light-transmitting sub-area and surrounding the opening hole; and
an encapsulation layer disposed on the second substrate;
wherein at least a one-circle structure of the spacer columns is disposed surrounding the opening hole, and heights of the spacer columns are gradually increased from a center of the opening hole to edges of the light-transmitting sub-area; and
the cathode layer covers the spacer columns and the second substrate, and the heights of the spacer columns range from 1 μm to 10 μm.

According to an embodiment of the present disclosure, wherein cross-sectional shapes of the spacer columns comprise curved surfaces, and openings of the curved surfaces face toward the center of the opening hole.

According to an embodiment of the present disclosure, wherein cross-sectional shapes of side surfaces of the spacer columns facing toward the opening hole are inclined planes.

According to an embodiment of the present disclosure, wherein cross-sectional shapes of the spacer columns comprise trapezoidal and triangular shapes.

According to an embodiment of the present disclosure, the display panel further comprises a light-transmitting material disposed in the light-transmitting sub-area.

According to an embodiment of the present disclosure, wherein the encapsulation layer comprises at least one inorganic layer and at least one organic layer disposed alternatingly.

In a second aspect, an embodiment of the present disclosure provides a display panel. The display panel comprises:
a display area including at least one light-transmitting sub-area;
wherein the display panel comprises:
a first substrate;
a second substrate disposed on the first substrate and provided with an opening hole at a position corresponding to the light-transmitting sub-area;
a cathode layer disposed on the second substrate;
a plurality of spacer columns disposed in the light-transmitting sub-area and surrounding the opening hole; and
an encapsulation layer disposed on the second substrate;
wherein at least a one-circle structure of the spacer columns is disposed surrounding the opening hole, and heights of the spacer columns are gradually increased from a center of the opening hole to edges of the light-transmitting sub-area.

According to an embodiment of the present disclosure, wherein the cathode layer covers the spacer columns and the second substrate.

According to an embodiment of the present disclosure, wherein cross-sectional shapes of the spacer columns comprise curved surfaces, and openings of the curved surfaces face toward the center of the opening hole.

According to an embodiment of the present disclosure, wherein cross-sectional shapes of side surfaces of the spacer columns facing toward the opening hole are inclined planes.

According to an embodiment of the present disclosure, wherein cross-sectional shapes of the spacer columns comprise trapezoidal and triangular shapes.

According to an embodiment of the present disclosure, wherein the heights of the spacer columns range from 1 μm to 10 μm.

According to an embodiment of the present disclosure, the display panel further comprises a light-transmitting material disposed in the light-transmitting sub-area.

According to an embodiment of the present disclosure, wherein the encapsulation layer comprises at least one inorganic layer and at least one organic layer disposed alternatingly.

In a third aspect, an embodiment of the present disclosure further provides a manufacturing method of a display panel. The method comprises following steps:

S100: providing a substrate and manufacturing each light-emitting device layer on the substrate;

S101: opening an opening hole in a corresponding light-transmitting sub-area of the display panel and disposing a structure of spacer columns on a pixel definition layer corresponding to the light-transmitting sub-area, wherein heights of the spacer columns are gradually increased along a direction away from a center of the light-transmitting sub-area;

S102: manufacturing a cathode layer and filling the light-transmitting sub-area; and S103: depositing an encapsulation layer and sealing to obtain the display panel.

According to an embodiment of the present disclosure, wherein in the step S102, the cathode layer covers the spacer columns, and a filling height in the light-transmitting sub-area is same as the heights of the spacer columns at edges of the light-transmitting sub-area.

According to an embodiment of the present disclosure, wherein the heights of the spacer columns range from 1 µm to 10 µm.

According to an embodiment of the present disclosure, wherein cross-sectional shapes of the spacer columns comprise trapezoidal and triangular shapes.

According to an embodiment of the present disclosure, wherein in the step S103, the encapsulation layer comprises at least one inorganic layer and at least one organic layer disposed alternatingly.

Beneficial effect: in summary, the beneficial effect of the embodiments of the present disclosure is: the present disclosure provides a display panel and a manufacturing method thereof by filling a light-transmitting material in a light-transmitting sub-area of the display panel, and meanwhile disposing multiple circles of spacer column structures along periphery of the light-transmitting sub-area. Wherein, heights of the spacer columns are increased with distances away from the light-transmitting sub-area. In addition, sides of the spacer columns facing toward the light-transmitting sub-area are inclined planes, and the inclined planes can reflect light and make the light emit to interior of the light-transmitting sub-area again, thereby improving light extraction efficiency, increasing light-emitting brightness of sub-pixels adjacent to the light-transmitting sub-area, and enhancing display effect of the light-transmitting sub-area.

DETAILED DESCRIPTION OF PREFERRED EMBODIMENTS

The specific embodiments described with reference to the attached drawings are all exemplary and are intended to illustrate and interpret the present disclosure.

Figure 1:
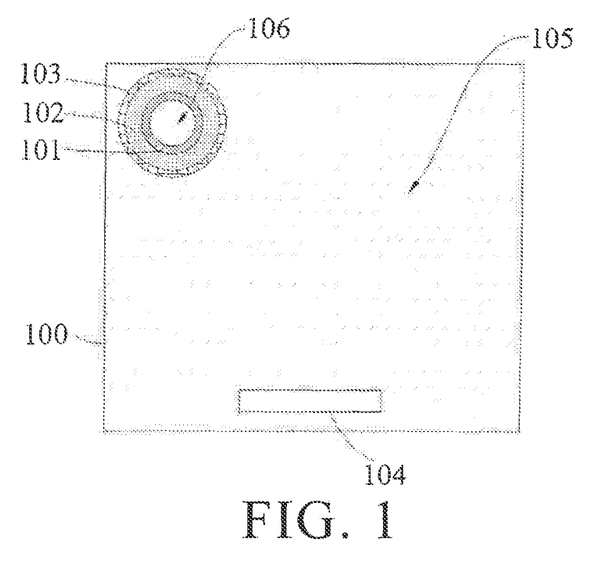
FIG. 1 is a schematic diagram of an opening hole area on a screen of a display panel according to an embodiment of the present disclosure.

In order to achieve multiple functions of a display panel, opening an opening hole would usually be performed on a display screen of the display panel. As shown in FIG. 1, FIG. 1 is a schematic diagram of an opening hole area on a screen of a display panel according to an embodiment of the present disclosure. A display panel 100 comprises a display area 105 and a light-transmitting sub-area 106. The light-transmitting sub-area 106 defined on the screen is formed by after opening an opening hole, so the light-transmitting sub-area 106 needs to be sealed after opening the opening hole. To ensure sealing effect, a first spacer layer 101 and a second spacer layer 103 are disposed surrounding the light-transmitting sub-area 106. The first spacer layer 101 and the second spacer layer 103 are all disposed surrounding a center of the light-transmitting sub-area 106, and a transition area 102 is further included between the first spacer layer 101 and the second spacer layer 103.

Because a panel can have different multiple functions, a plurality of light-transmitting sub-areas 106 can be defined to dispose devices having different functions in the different plurality of light-transmitting sub-areas 106. In an embodiment of the present disclosure, the display panel further comprises a touch control device 104 or other devices, such as a camera device and a sensor device.

The light-transmitting sub-area 106 of the opening hole on the screen cannot achieve normal image-display function and will present a black picture, which affect display effect. Meanwhile, the opening hole area also hinders development of full screen display panels.

In the embodiment of the present disclosure, the light-transmitting sub-area 106 can normally transmit light. When displaying, the light-transmitting sub-area 106 in the display screen has brightness, which causes the light-transmitting sub-area 106 to integrate with the entire screen on sense and display and will not show a black opening hole.

Figure 2:
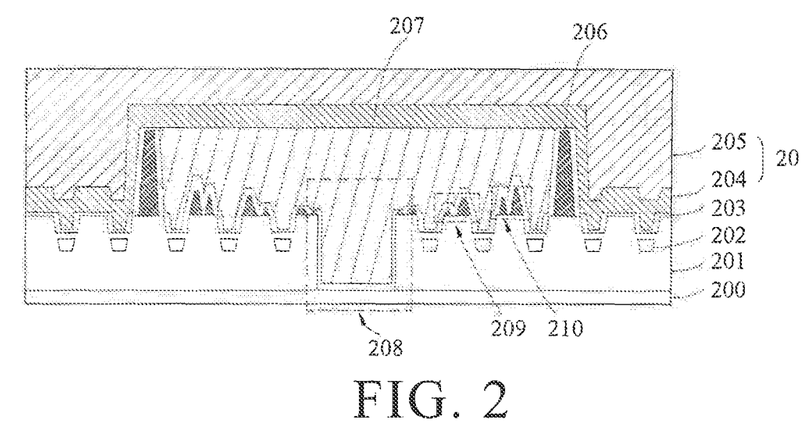
FIG. 2 is a schematic structural diagram of each layer of a display panel according to an embodiment of the present disclosure.

In an embodiment of the present disclosure, as shown in FIG. 2, FIG. 2 is a schematic structural diagram of each layer of a display panel according to an embodiment of the present disclosure. The display panel includes a first substrate 200 and a second substrate 201. The second substrate 201 is disposed on the first substrate 200. In the embodiment of the present disclosure, the first substrate 200 mainly comprises a glass substrate and a polyimide substrate, and the second substrate 201 is mainly each light-emitting device layer of the display panel.

Specifically, the second substrate 201 comprises each device layer of thin film transistors, a planarization layer, a common electrode layer, a pixel definition layer, etc. The above structures of each film layer are disposed according to structures of each film layer in current display panel, which will not be described in detail. In each device layer of thin film transistors, an interlayer dielectric layer is further included. Meanwhile, each color resist layer 202 is disposed on the second substrate 201 corresponding to the display area. The color resist layer 202 comprises a red light-emitting material layer, a blue light-emitting material layer, or a green light-emitting material layer to achieve normal light-emitting display of the display panel.

The second substrate 201 further comprises an opening hole area 208, and the opening hole area 208 is disposed in the corresponding light-transmitting sub-area 209 of the display panel. After disposing the above each film layer in the second substrate 201, an opening hole is set in the planarization layer of the second substrate 201 and each film layer on the planarization layer. In this way, the opening hole area 208 will not affect normal illumination of thin film transistor devices in the display panel and the opening hole process in the opening hole area 208 can be achieved.

The display panel further comprises a plurality of spacer columns 206 disposed in the light-transmitting sub-area 209. Because the opening hole is disposed in the light-transmitting sub-area 209, when disposing the spacer columns 206, the spacer columns 206 can be disposed surrounding edges of the opening hole, and one circle of spacer columns 206 or multiple circles of spacer columns 206 can be disposed. Multiple circles of spacer column structures can effectively improve effect of spacers, as shown in FIG. 2, where there are a second circle of spacer columns 210 and a third circle of spacer columns 211 disposed surrounding the second circle of spacer columns 210. In each circle of spacer columns 206, a plurality of little spacer column units also can be disposed to further improve the effect of spacers of each circle of spacer columns and performance of the display panel.

Specifically, the existence of the opening hole area 208 causes light transmission in the opening hole area 208 to change. In order to improve the light transmission in the opening hole area 208 and display effect of the screen, when disposing the spacer columns 206, using a center of the light-transmitting sub-area 209 or a center of the opening hole area 208 as a reference, heights of the spacer columns 206 are gradually increased along the center of the opening hole area 208 toward the edges of the opening hole area 208. That is, the heights of the outermost circle of the spacer columns 206 are highest. Meanwhile, for a plurality of spacer columns 206 in a same circle, a height of each spacer column 206 is disposed by gradually increasing same according to along the center of the opening hole area 208 toward the edges. In this way, when light transmits in the opening hole area 208, spacer columns 206 of inner circles will not hinder spacer columns 206 of outer circles from reflecting and transmitting light. Furthermore, in a same circle, light reflected from lower spacer columns 206 will be reflected to higher spacer columns 206 and further be reflected by the higher spacer columns 206, thereby improving light extraction efficiency to allow more light to integrate to a surface of the light-transmitting sub-area 209, preventing light in the light-transmitting sub-area 209 from being weaker, and improving the display effect of panel.

Figure 3:
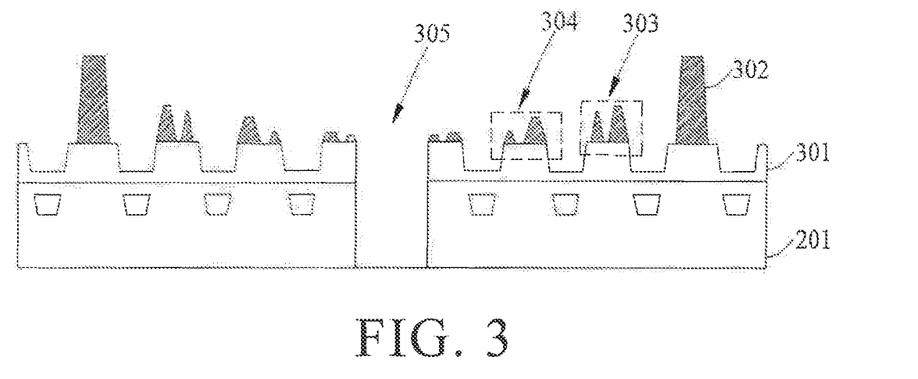
FIG. 3 is a schematic cross-sectional structural diagram of spacer columns of a display panel according to an embodiment of the present disclosure.

Specifically, as shown in FIG. 3, FIG. 3 is a schematic cross-sectional structural diagram of spacer columns of a display panel according to an embodiment of the present disclosure. The display panel includes a second substrate 201, a pixel definition layer 301, and spacer columns 302. The pixel definition layer 301 is disposed on the second substrate 201. Meanwhile, a patterning process is further performed on the pixel definition layer 301 to pattern devices, such as a light-emitting material, in the area.

For the spacer columns 302 in the embodiment of the present disclosure, the spacer columns 302 are disposed surrounding an opening hole area 305 and disposed in a non-pixel area of the pixel definition layer 301 to prevent the spacer columns 302 from blocking light. Heights of the spacer columns 302 are gradually increased away from the opening hole area 305, as shown in the figure, a height of the innermost side of spacer column 304 is the lowest, and a height of the outermost side of spacer column 302 is the highest.

Cross-sectional shapes of the spacer columns can be disposed as a convex-concave structure. In the embodiment of the present disclosure, it is preferably trapezoidal, as structures of a second spacer column 304 and a third spacer column 303 shown in the figure. Meanwhile, in each circle of the spacer column structures, preferably, it further comprises two spacer column sub-units. In addition, in each circle of the spacer columns, heights of the spacer columns adjacent to the opening hole area 305 are less than the heights of the spacer columns away from the opening hole area 305. Each spacer column sub-unit in each circle can be in contact with each other or not be in contact with each other, which can be specifically designed according to structures of practical products to ensure the display effect of the panel.

Figure 4:
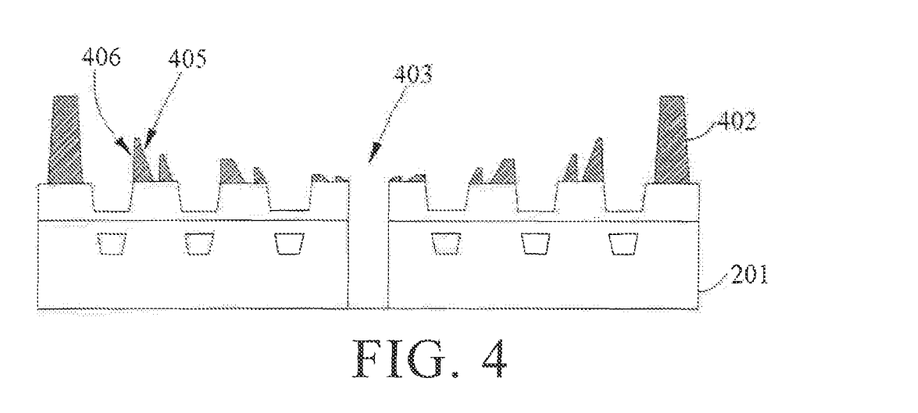
FIG. 4 is another schematic cross-sectional structural diagram of spacer columns of a display panel according to an embodiment of the present disclosure.

Preferably, as shown in FIG. 4, FIG. 4 is another schematic cross-sectional structural diagram of spacer columns of a display panel according to an embodiment of the present disclosure. Cross-sectional structures of spacer columns 402 comprise a first inclined plane 405 and a second inclined plane 406. In order to improve reflection effect of light for the spacer columns 402 in an opening hole area 403, for each inclined plane of the spacer columns 402 corresponding to the opening hole area 403, the first inclined plane has the most significant effect of reflection and influence of light. An included angle between a hypotenuse of the first inclined plane 405 and a pixel definition layer between the spacer columns 402 formed by the first inclined plane 405 is greater than 90°. An included angle between the second inclined plane 406 and the spacer columns formed by the second inclined plane 406 can be greater than or less than 90°, In this way, when light is transmitted from the opening hole area 403 to the spacer columns 402, according to route of light transmission and reflection, the first inclined plane of the spacer columns 402 can reflect light to the light-transmitting sub-area, thereby improving intensity and display effect of light in the light-transmitting sub-area.

Figure 5:
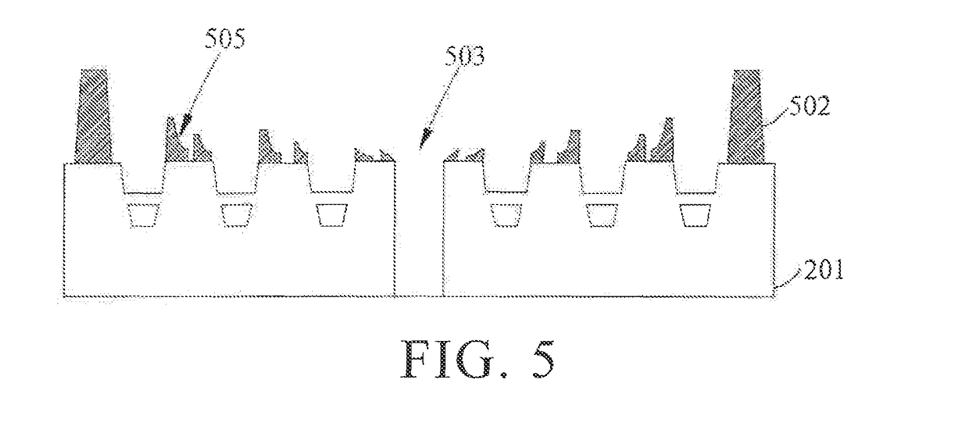
FIG. 5 is another schematic cross-sectional structural diagram of spacer columns of a display panel according to an embodiment of the present disclosure.

As shown in FIG. 5, FIG. 5 is another schematic cross-sectional structural diagram of spacer columns of a display panel according to an embodiment of the present disclosure. Cross-sectional shapes of the spacer columns 502 comprise curved surfaces 505. The curved surfaces 505 need to reflect light. Therefore, openings of the curved surfaces 505, that is, centers of the curved surfaces, face toward an opening hole area 503. Therefore, the curved surfaces 505 can reflect light and emit light as much as possible to improve light extraction efficiency in the light-transmitting sub-area of the display panel.

Structures of the spacer columns 502 further comprise wedge structures, triangular structures, zigzag structures, or hemispherical structures, and the different structural designs are all beneficial for compensating light to gather in the opening hole area and improve light extraction efficiency.

For the spacer columns in a same circle, all adjacent spacer columns can be disposed on a same pixel definition layer, that is, bottoms of each spacer column are disposed on a same plane; or the adjacent spacer columns are disposed step-wisely, and heights of steps of the spacer columns away from the opening hole area are greater than heights of steps of the spacer columns adjacent to the opening hole area. In this way, it can also ensure light reflection effect of each spacer column and improve light extraction efficiency.

Preferably, the heights of the spacer columns range from 1 μm to 10 μm. For specific products, a height of each circle of spacer columns can be set according to actual situations. Meanwhile, when disposing the opening hole area, the opening hole area can be a regular shape, such as circular, square, or oval, and it can also be disposed as a structure having an irregular shape according to different structures of arranged sub-pixels. However, for different shapes of the opening hole area, all disposing structures of outside spacer columns thereof can be disposed according to the shapes and structures of the spacer columns in the embodiments of the present disclosure, and the peripheral spacer column structures are disposed by surrounding the shape of the opening hole area to achieve the best light-transmitting effect.

Further, combined with the structure shown in FIG. 2, in an embodiment provided by the present disclosure, the display panel further comprises a cathode layer 203. The cathode layer 203 is disposed on the second substrate 201 and covers the second substrate 201 and corresponding film layers in the opening hole area 208. After disposing the spacer columns 206 of the display panel, the cathode layer 203 covers each of the spacer columns 206 at the same time. A light-emitting material is further disposed in the corresponding light-emitting area of the cathode layer 203 and the second substrate 201 to achieve light-emitting display function of the panel.

Further, the display panel of the embodiment of the present disclosure further comprises a light-transmitting material 207 and an encapsulation layer 20. The light-transmitting material 207 is filled in the light-transmitting sub-area 209 and is fully filled in the light-transmitting sub-area 209 and the opening hole area 208. A filling height thereof is flush with a height of the outermost side of spacer column 206 to achieve the best filling effect. The light-transmitting material 207 has a higher light transmittance and may comprise organic light-transmitting materials, such as a polyimide material. Filling can be achieved by inkjet printing when disposing.

Figure 6:
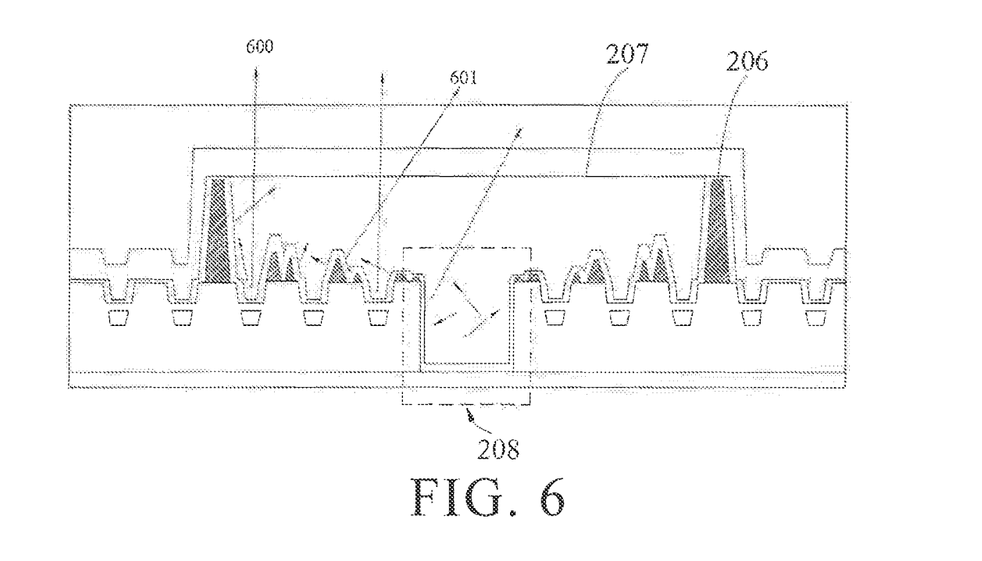
FIG. 6 is a schematic diagram of reflection effect of light according to an embodiment of the present disclosure.

Specifically, as shown in FIG. 6, FIG. 6 is a schematic diagram of reflection effect of light according to an embodiment of the present disclosure. In the entire light-transmitting sub-area, light transmits in the opening hole area 208 by the light-transmitting material 207 and the structures of the spacer columns 206, and meanwhile the light is reflected by the light-transmitting material 207 and reflected again by the spacer columns 206 to form emitting light, such as first emitting light 600 and second emitting light 601. A part of light emitted by sub-pixels in walls of ring-shaped spacer columns 206 will be diffusely reflected to inclined planes of the spacer columns 206, be gathered to the center of the light transmitting area by the step-wise ring-shaped walls, and reach an outer surface of the light-transmitting sub-area. From the emitting light in the embodiment of the present disclosure, it can be known that emitted light makes an under-display camera area of the display panel no longer display a black picture, and because the light is reflected by light emitted from adjacent sub-pixels, the picture and surrounding images can be integrated into one, thereby fully decreasing impact of the opening area of the under-display camera on the appearance of the panel. In addition, an embodiment of the present disclosure can also adjust luminous brightness of sub-pixels adjacent to a light-transmitting hole by circuit and display algorithm compensation design to further improve the display effect in the light-transmitting hole area.

For the encapsulation layer 20, the encapsulation layer 20 includes at least a first inorganic layer 204 and a first organic layer 205. The first inorganic layer 204 is disposed on the cathode layer 203 and covers the cathode layer 203 and the light-transmitting material 207. The first inorganic layer 204 can effectively block materials from diffusing among each interior film layer and provides a protection effect for the interior of the panel. The first organic layer 205 is disposed on the first inorganic layer 204, and meanwhile, a second inorganic layer is disposed on the first organic layer 205. In order to achieve the best encapsulation effect, the first organic layer 205 and the first inorganic layer 204 can be disposed alternatingly, thereby improving packaging performance.

Wherein, materials of the first inorganic layer 205 and the second inorganic layer comprise $SiN_x$, $SiO_xN_y$, $SiO_x$, $SiC_xN_y$, ZnO, $AlO_x$, etc. to ensure flatness of entire plane of the first inorganic layer after depositing.

Figure 7:
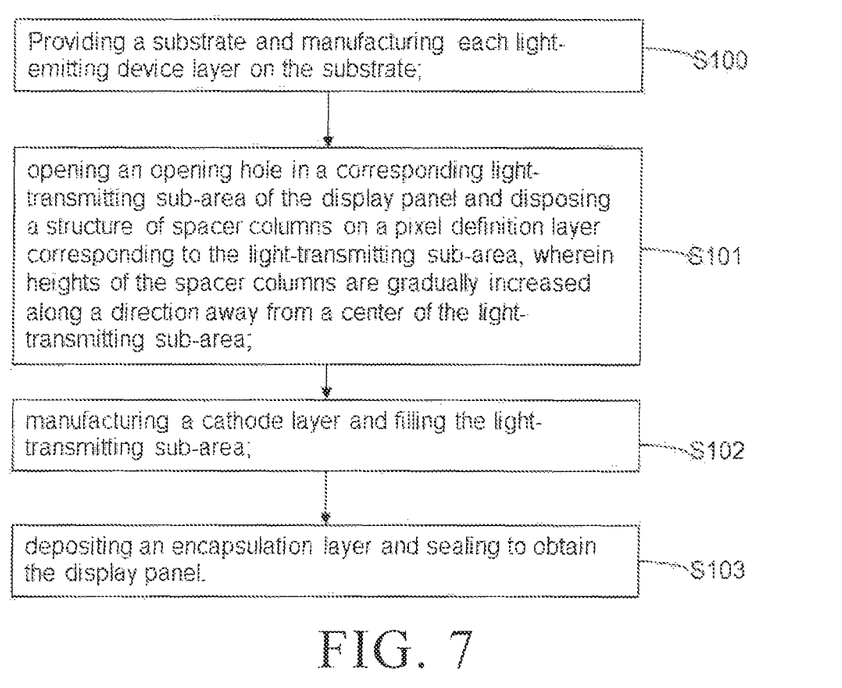
FIG. 7 is a flowchart of a manufacturing method of a display panel according to an embodiment of the present disclosure.

An embodiment of the present disclosure further provides a manufacturing method of a display panel. As shown in FIG. 7, FIG. 7 is a flowchart of a manufacturing method of a display panel according to an embodiment of the present disclosure. The manufacturing method comprises following steps:

S100: providing a substrate and manufacturing each light-emitting device layer on the substrate.

Each film layer of the display panel is manufactured on the substrate first, and when manufacturing each film layer structure of the display panel, each film layer and manufacturing methods thereof are all performed according to conventional processes of a display panel, which is not described in detail.

S101: opening an opening hole in a corresponding light-transmitting sub-area of the display panel and disposing a structure of spacer columns on a pixel definition layer corresponding to the light-transmitting sub-area, wherein heights of the spacer columns are gradually increased along a direction away from a center of the light-transmitting sub-area.

After manufacturing each light-emitting device of the display panel, an opening hole is opened on the pixel definition layer in the corresponding light-transmitting sub-area of the display panel. Meanwhile, the spacer column structures are disposed in peripheral areas of the opening hole to form a ring-shaped light-scattering area to reflect or scatter light. The light-scattering area comprises at least one circle of the spacer column structures, and heights of the spacer columns are increased by gradients within a predetermined range along a direction away from the center of the light-transmitting hole to form a light-gathering area having step-wise ring-shaped walls in effect, thereby improving light extraction efficiency in the light-transmitting sub-area.

S102: manufacturing a cathode layer and filling the light-transmitting sub-area.

After disposing the spacer column structures, an organic light-emitting material and a cathode layer are evaporated normally. The cathode layer material will cover the step-wise spacer columns to form a light-reflecting coating, a highly transparent organic material is used to fill the opening hole area, and a filling height of the light-transmitting material is flush with a height of the outermost ring-shaped spacer columns.

S103: depositing an encapsulation layer and sealing to obtain the display panel.

Encapsulation is performed on the display panel. After disposing the cathode layer, a first layer of inorganic encapsulation layer is deposited. A depositing method thereof is not limited to ion-enhanced chemical vapor deposition, atomic layer deposition, pulsed laser deposition, and magnetron sputtering. A material thereof is not limited to $SiN_x$, $SiO_xN_y$, $SiO_x$, $SiC_xN_y$, ZnO, and $AlO_x$. When depositing a first organic layer, it is required to make the surface of the display panel flat. Subsequently, depositing a second inorganic layer normally. A depositing method thereof is not limited to ion-enhanced chemical vapor deposition, atomic layer deposition, pulsed laser deposition, and magnetron sputtering.

At last, the display panel provided by the embodiments of the present disclosure is obtained.

The display panel and the manufacturing method thereof provided by the present disclosure are described in detail above. The description of the above embodiments is only for helping to understand the technical solution of the present disclosure and its core ideas, and it is understood that many changes and modifications to the described embodiment can be carried out without departing from the scope and the spirit of the disclosure that is intended to be limited only by the appended claims.

What is claimed is:

1. A display panel, comprising a display area including at least one light-transmitting sub-area;
   wherein the display panel comprises:
   a first substrate;
   a second substrate disposed on the first substrate and provided with an opening hole at a position corresponding to the light-transmitting sub-area;
   a cathode layer disposed on the second substrate;
   a plurality of spacer columns disposed in the light-transmitting sub-area and surrounding the opening hole; and
   an encapsulation layer disposed on the second substrate;
   wherein at least a one-circle structure of the spacer columns is disposed surrounding the opening hole, and heights of the spacer columns are gradually increased from a center of the opening hole to edges of the light-transmitting sub-area; and
   the cathode layer covers the spacer columns and the second substrate, and the heights of the spacer columns range from 1 μm to 10 μm.

2. The display panel according to claim 1, wherein cross-sectional shapes of the spacer columns comprise curved surfaces, and openings of the curved surfaces face toward the center of the opening hole.

3. The display panel according to claim 1, wherein cross-sectional shapes of side surfaces of the spacer columns facing toward the opening hole are inclined planes.

4. The display panel according to claim 3, wherein cross-sectional shapes of the spacer columns comprise trapezoidal and triangular shapes.

5. The display panel according to claim 1, further comprising a light-transmitting material disposed in the light-transmitting sub-area.

6. The display panel according to claim 1, wherein the encapsulation layer comprises at least one inorganic layer and at least one organic layer disposed alternatingly.

7. A display panel, comprising a display area including at least one light-transmitting sub-area;
   wherein the display panel comprises:
   a first substrate;
   a second substrate disposed on the first substrate and provided with an opening hole at a position corresponding to the light-transmitting sub-area;
   a cathode layer disposed on the second substrate;
   a plurality of spacer columns disposed in the light-transmitting sub-area and surrounding the opening hole; and
   an encapsulation layer disposed on the second substrate;
   wherein at least a one-circle structure of the spacer columns is disposed surrounding the opening hole, and heights of the spacer columns are gradually increased from a center of the opening hole to edges of the light-transmitting sub-area.

8. The display panel according to claim 7, wherein cross-sectional shapes of the spacer columns comprise curved surfaces, and openings of the curved surfaces face toward the center of the opening hole.

9. The display panel according to claim 7, wherein cross-sectional shapes of side surfaces of the spacer columns facing toward the opening hole are inclined planes.

10. The display panel according to claim 9, wherein cross-sectional shapes of the spacer columns comprise trapezoidal and triangular shapes.

11. The display panel according to claim 7, wherein the cathode layer covers the spacer columns and the second substrate.

12. The display panel according to claim 7, wherein the heights of the spacer columns range from 1 μm to 10 μm.

13. The display panel according to claim 7, further comprising a light-transmitting material disposed in the light-transmitting sub-area.

14. The display panel according to claim 7, wherein the encapsulation layer comprises at least one inorganic layer and at least one organic layer disposed alternatingly.

15. A manufacturing method of a display panel, comprising following steps:
   S100: providing a substrate and manufacturing each light-emitting device layer on the substrate;
   S101: opening an opening hole in a corresponding light-transmitting sub-area of the display panel and disposing a structure of spacer columns on a pixel definition layer corresponding to the light-transmitting sub-area, wherein heights of the spacer columns are gradually increased along a direction away from a center of the light-transmitting sub-area;
   S102: manufacturing a cathode layer and filling the light-transmitting sub-area; and
   S103: depositing an encapsulation layer and sealing to obtain the display panel.

16. The manufacturing method of the display panel according to claim 15, wherein in the step S102, the cathode layer covers the spacer columns, and a filling height in the light-transmitting sub-area is same as the heights of the spacer columns at edges of the light-transmitting sub-area.

17. The manufacturing method of the display panel according to claim 16, wherein the heights of the spacer columns range from 1 μm to 10 μm.

18. The manufacturing method of the display panel according to claim 16, wherein cross-sectional shapes of the spacer columns comprise trapezoidal and triangular shapes.

19. The manufacturing method of the display panel according to claim 15, wherein in the step S103, the encapsulation layer comprises at least one inorganic layer and at least one organic layer disposed alternatingly.

* * * * *